United States Patent [19]

Foster

[11] Patent Number: 5,266,903
[45] Date of Patent: Nov. 30, 1993

[54] SHIELDED CONNECTOR FOR MAKING ELECTRICAL CONNECTIONS TO A CIRCUIT BOARD IN THE FORM OF A CAPACITIVE PROBE

[75] Inventor: Robert L. Foster, Groton, Mass.

[73] Assignee: Capacitec, Ayer, Mass.

[21] Appl. No.: 893,338

[22] Filed: Jun. 3, 1992

[51] Int. Cl.$^5$ .................. G01R 27/26; G01R 1/067; H01R 9/09
[52] U.S. Cl. .................. 324/690; 324/662; 439/629; 439/637
[58] Field of Search ............ 324/452, 662, 690, 158 F, 324/158 P; 439/59, 60, 63, 92, 629, 637; 361/331, 395, 397, 413

[56] References Cited

U.S. PATENT DOCUMENTS

| | | | |
|---|---|---|---|
| 3,654,592 | 4/1972 | Primorac | 439/637 |
| 4,166,667 | 9/1979 | Griffin | 439/637 |
| 4,285,565 | 8/1981 | Kirby | 439/637 |
| 4,361,955 | 12/1982 | Lancaster | 439/59 X |
| 4,574,235 | 3/1986 | Kelly et al. | 324/158 F |
| 4,766,368 | 8/1988 | Cox | 324/662 X |
| 4,894,612 | 1/1990 | Drake et al. | 324/158 F X |
| 5,040,991 | 8/1991 | Collier | 439/637 X |

Primary Examiner—Gerard R. Strecker
Assistant Examiner—Diep Do
Attorney, Agent, or Firm—Wolf, Greenfield & Sacks

[57] ABSTRACT

A connector is provided, for making electrical connections to a replaceable circuit card. A shielded connection is provided by the connector, maintaining high signal integrity without degradation of S/N ratio by loss of signal or introduction of external noise as a result of connection characteristics without noise across the connection. The circuit card includes only features which are inexpensive to produce, resulting in a low circuit card replacement cost.

13 Claims, 7 Drawing Sheets

SHIELDED CONNECTOR FOR MAKING ELECTRICAL CONNECTIONS TO A CIRCUIT BOARD IN THE FORM OF A CAPACITIVE PROBE

BACKGROUND

1. Field of the Invention

The present invention relates generally to connectors and more particularly to fully shielded, edge card connectors for use with capacitive proximity probes and like devices.

2. Description of Prior Art

The difficult measurement problem of determining the size of thin gaps in machinery and machine parts is presently addressed by such means as mechanical feeler gauges and thin capacitive proximity probes. Electronic measurement devices are preferred over mechanical means, since electronic measurement devices typically avoid the contact between the probe and the workpiece, often required by mechanical devices. Electronic devices also yield significantly higher measurement accuracy.

To achieve maximum sensitivity and range with a given probe size, capacitive probes may employ a shielded signal path from the sensing region of the probe to an apparatus for generating and receiving probe signals. Thus, one area of significant development in the capacitive probe art is that of providing adequate shielding of connections between the probe and associated cable. One capacitive probe of the prior art, which is shown in FIG. 1, receives signal and shield conductors in a soldered connection 100 to a shielded coaxial cable 107. However, the configuration of FIG. 1 does not provide any shielding of the exposed portions of the signal conductors 101, the signal trace 103 or below the sensing region 105. Coaxial cable 107 is provided with a braided shield 109 for shielding signal conductor 101 up to a region 110 where signal conductor 101 is exposed to permit formation of the soldered connection 100 between signal conductor 101 and plated through hole 111. Ambient noise signals may impinge on region 110, thus introducing noise, or region 11 may couple a signal carried on signal conductor 101 to an undesired point, because of the lack of shielding in region 110. Braided shield 109 is connected by a second solder joint to plated through hole 113 for forming a connection with shield trace 115. Shield trace 115 provides some shielding for the signal trace 103 and the sensing region 105 in a direction co planar with those traces. However, as described above, no shielding is provided below signal trace 103 or sensing region 105, or above signal trace 103. Thus, the above described prior art does not provide maximum sensitivity or accuracy, since signal leaked from signal trace 103, for example, will be interpreted as part of the signal at sensing region 105. Furthermore, ambient noise signals capacitively coupled into the probe from the outside environment may also contribute to measurement error.

FIG. 2 is an exploded view of an improved probe construction of the prior art which achieves 100% shielding at the desired frequencies of operation by providing some metallic shield conductor coverage over the entire signal path. In this construction, a laminate is formed of a series of insulating substrates 201, 203 and 205, each of which carries conductive traces. Substrate 201 carries a signal trace 103 and a sensing region 105. A solder connection between signal conductor 101 and a contact pad 219 is formed at an end of signal trace 103 opposite sensing region 105. Substrate 203 carries a shield trace 207 for shielding below signal trace 103, sensing region 105 and contact pad 219. Substrate 205 carries ring shield trace 209 for shielding above signal trace 103 and contact pad 219, while providing an unshielded aperture 21 above sensing region 105. Shield braid 109 is disposed in contact with and soldered to plated through hole 113, and further extends through hole 221 and is also soldered to shield trace 207. The entire assembly is laminated together and affixed to a carrier substrate 213. A protective cover 215 may also be provided and affixed over the assembly. Thus the shield braid 109 in connection with shield layers 209 and 207 above and below the signal trace 103 assure a continuous shield everywhere but the aperture 210 above the sensing region 105.

Thin probes are desirable in order to measure the size of extremely narrow openings, such as the spacing between adjacent parts of a machine. However, extremely thin probes are subject to wear or breakage. Thus, in order to facilitate replacement of a worn probe by a user, the probe is connected to the measurement apparatus through a cable 107 having a connector 217 at one end.

The cable 107 is generally of a thin, flexible coaxial type. A miniature coaxial connector 217 is provided for connecting the probe assembly to measurement equipment (not shown). However, miniature coaxial connectors presently available are relatively expensive and along with the cable typically form a substantial portion of the selling price of a finished probe. Furthermore, the cable and connector are permanently attached to the probe body by the permanent solder joints. The cost of direct labor to construct the joint is another substantial portion of the selling price of probes of the prior art.

Although capacitive probes are typically used in conjunction with non-contact techniques, they are subject to wear and accidental breakage from constant handling and some frictional abrasion, as noted above. Thus, an expensive probe assembly is costly to the consumer, who must maintain equipment including these probes. The consumer desires an inexpensive probe which is easy to replace. Furthermore, the consumer would prefer to move any cost burden away from replaceable components of a system, in favor of the fixed components of a system.

Further, capacitive probes of the prior art that have been illustrated and described thus far include only one sensing region 105 and signal trace 103; however probes are known which include multiple sensing regions, each fed by a separate signal wire. In such a device, the number of cables, connectors and solder joints which constitute the more expensive portions of the probe are multiplied accordingly. For example, in a probe including two sensing regions, each fed by a separate signal wire, two cables and connectors would typically be used. Thus, in this example, the high cost to the consumer discussed above is doubled.

Accordingly, it is a general aim of the present invention to provide an inexpensive, shielded connection from one or more signal conductors in one or more shielded cables to a thin, flat circuit board, which may be subjected to replacement, such as a capacitive probe.

SUMMARY OF THE INVENTION

In accordance with the foregoing aim and such other objects and aims as will be apparent to those skilled in the art, the present invention provides a shielded connector for use with a thin circuit board to provide one or more shielded connections from signal contacts of the connector to signal conductors of the circuit board. The connector further includes at least one shield and corresponding shield contact for making electrical connections to shield conductors of the circuit board.

The circuit board may be a printed wiring card or a flex circuit, constructed using techniques known in those arts for producing multiple layer circuits. The printed wiring card or flex circuit may, for example, have three or more conductive layers: at least one signal layer; and two shield layers for each signal layer. One shield layer is disposed above each signal layer and another shield layer is disposed below each signal layer. The elements of the connector associated with the circuit board may be contact pads formed on an outer surface at one end of the circuit board by, for example, known printed wiring card manufacturing techniques. The conductive layers are carried on insulating substrates, whereby the layers are insulated from each other.

Construction of a connector and circuit board according to the present invention will be better understood with reference to the accompanying drawing, wherein like numerals indicate like elements. The illustrated circuit boards are capacitive probes of the same general type described earlier.

DETAILED DESCRIPTION

Embodiments of the present invention are now described with reference to the accompanying figures, wherein like numerals indicate like elements.

Figure 3:
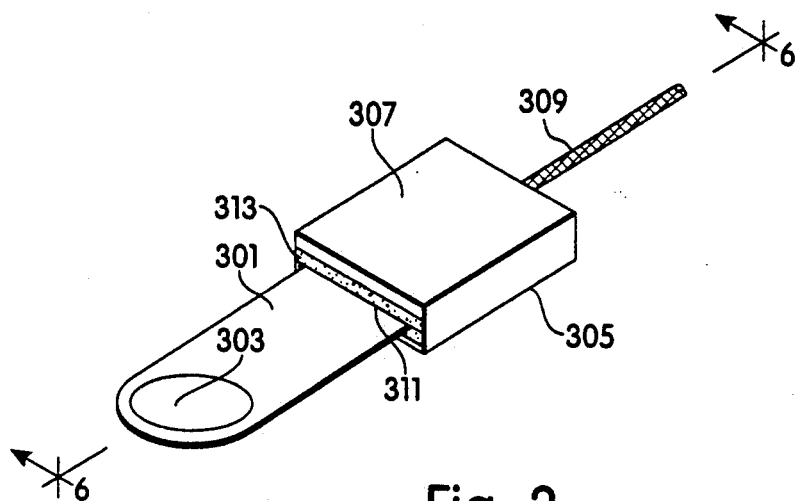
FIG. 3 is a perspective view of a probe and connector according to the present invention.

The main elements of a probe and connector according to the present invention are shown in FIG. 3. The probe body 301 of this embodiment may be a printed wiring card or a flex circuit, either of which have multiple layers. The layers of the probe body 301 are alternating layers of insulating substrate and metallic, conductive films. Disposed near one end of the probe body is an active region 303. The opposite end of probe body 301 is inserted into an opening 311 of connector body 305. In this preferred embodiment, the connector body 305 has an external, conductive shield 307, which wraps around the connector components on six sides, having an opening provided (not shown) at the back of the connector body 305 for receiving a coaxial cable 309 and opening 311 provided at the front of the connector body for receiving the end of probe body 301.

Figure 5:
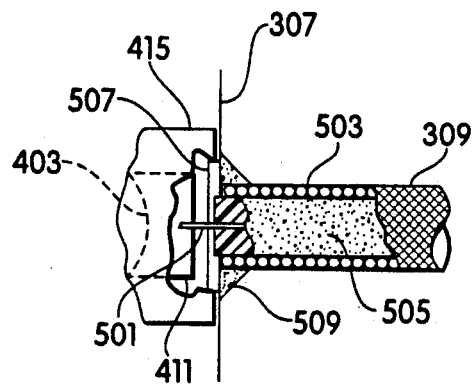
FIG. 5 is a detail enlargement of the plan view of FIG. 4 showing the connection of the cable with the connector body.
Figure 6:
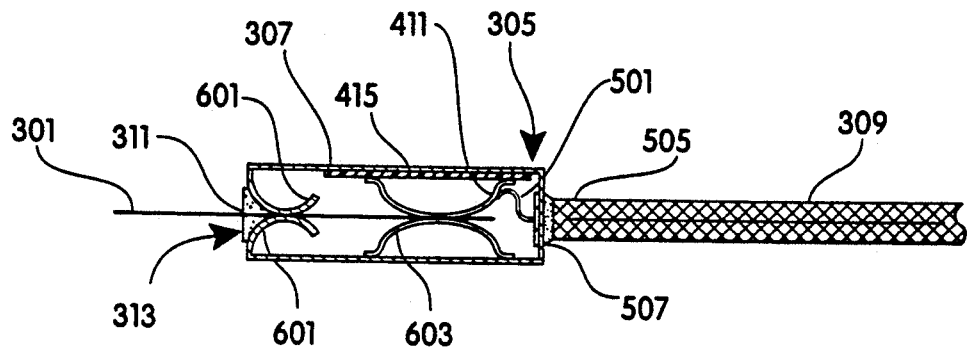
FIG. 6 is a cross-sectional, elevation view of the probe and connector of the present invention, taken along line 6—6 in FIG. 3.

The opening 311 for receiving the probe body 301 may be further sealed with conductive foam 313; however, this is optional, as will be seen in connection with FIG. 6. Thus, there is a conductive shield provided on six sides including the front of the connector body 305. It will be seen in the discussion of FIG 5, how a conductive shield is provided at the back of the connector body 305. Although, in the preferred embodiment conductive shield 307 is a conductive, outermost layer of the connector body 305, the connector body 305 may be further encapsulated in an insulating material, if so desired.

Figure 4:
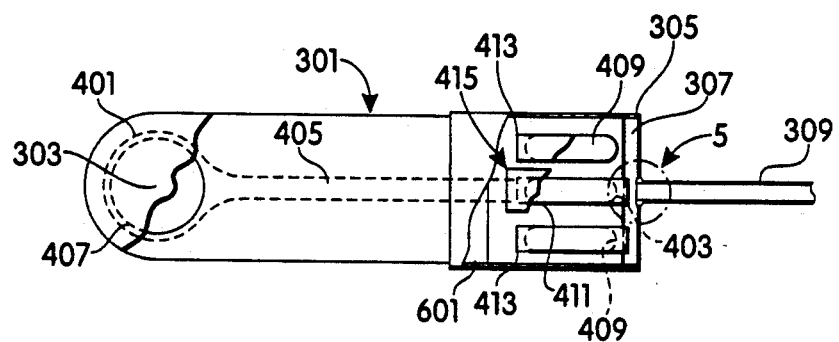
FIG. 4 is a partial cutaway, top plan view of the probe and connector of the present invention.

The elements within the connector body 305 and their relationships to the elements of the probe body 301 are now described with reference to FIG. 4. The construction of probe body 301 is shown in greater detail in FIG. 5. The probe body 301 includes a sensor conductor 401 electrically connected to a signal contact pad 403 by a signal wire 405. Signal wire 405 is shielded above by a sheet of conductive material having an opening 407 which substantially coincides with the sensor conductor 401 to form active region 303. A similar conductive sheet is disposed below, but is arranged to at least coincide with sensor conductor 401, signal wire 405, and signal contact pad 403. Both conductive sheets are electrically insulated from the sensor conductor 401, signal wire 405 and signal contact pad 403 by printed circuit substrate layers, as noted earlier, but are electrically connected to each other and shield contact pads 409. This may be achieved by providing openings through some layers of the structure to provide access to other layers of the structure as shown in FIG. 5.

A signal contact 411 within connector body 305 is disposed in direct opposition with signal contact pad 403 when probe body 301 is inserted in the connector body 305, whereby an electrical connection is made between signal contact 411 and signal contact pad 403. Similarly, shield contacts 413 within connector body 305 make electrical connections with shield contact pads 409. Shield contacts 413 are disposed in electrical contact with the conductive shield 307, whereas signal contact 411 is electrically isolated from the conductive shield 307 by an insulating pad 415. These features will be set forth in further detail in connection with the discussion of FIG. 6, below.

The connections between connector body 305 and the coaxial cable 309 are now described with reference to FIG. 5, which illustrates the detailed area 5 in FIG. 4. Coaxial cable 309 contains an inner, signal conductor 501 and an outer, shield conductor 503 separated by an insulator 505. The back end of conductive shield 307 includes a hole, into which insulating block 507 is anchored, by adhesive for example. Insulating block 507 serves to retain coaxial cable 309 in a position such that signal conductor 501 does not come in contact with conductive shield 307. However, shield conductor 503 is soldered to conductive shield 307 by a solder fillet 509 disposed around the entire periphery of a joint between cable 309 and conductive shield 307, and providing an electrical connection therebetween. Thus, the shield conductor 503 combines with conductive shield 307 to provide a conductive shield at the back of connector body 305. Signal conductor 501 is electrically connected to signal contact 411 by means of soldering, crimping, or other such suitable means known in the art.

The cross-sectional view of FIG. 6 taken along line 6-6 of FIG 3, shows the means of establishing a stable connection between the probe body 301 and the contacts 411, 413 disposed within the connector body 305.

Rolled edges at the front of conductive shield 307 form springy lips 601 for shielding the front of conductive shield 307, while allowing access to the interior by probe body 301. Thus, springy lips 601 form opening 311 for receiving the probe body 301 into the connector body 305. As previously noted in connection with FIG. 3, the front opening 311 of connector body 305 may be further electrically sealed with conductive foam 313, if springy lips 601 do not provide adequate shielding at the front of connector body 305. Conductive foam 313 includes a slit which forms an extension to the front opening 311 of connector body 305. The slit is normally closed, since conductive foam 315 is applied to springy lips 601 under slight compression. Thus, probe body 301 may be received into front opening 311, through the slit in conductive foam 313, further compressing foam 313 to form a good electrical seal with the surface of probe body 301.

Signal contact 411 is an arcuately shaped contact acting as a spring in opposition with arcuately shaped contact 603. As noted earlier, signal contact 411 is electrically isolated from conductive shield 307 by insulating pad 415. Although the primary purpose of contact 603 is to balance the spring force of signal contact 411, contact 603 could be used to make an electrical connection with contact pads located on the back side of probe body 301, as illustrated in an alternate embodiment in FIGS. 8 and 9. However, in this preferred embodiment, only signal contact 411 is electrically connected to a signal wire 501. Shield contacts 413 (not shown) have a similar shape as signal contact 411; however by being disposed to the sides of insulating pad 415, as illustrated in FIG. 4, shield contacts 413 are electrically connected to conductive shield 307.

Figure 7A:
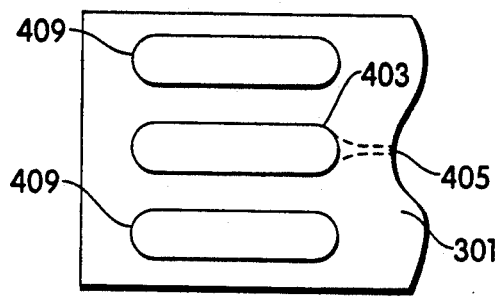
FIG. 7A is a detail enlargement of the plan view of FIG. 4 showing the contact region of the probe of the present invention.

The contact pad configuration of one embodiment is illustrated in FIG. 7A. At an end opposite the end having sensing region 303, probe body 301 has a signal contact pad 403 and a pair of shield contact pads 409 disposed to each side of signal contact pad 403. The particular contact pad configuration of this embodiment is shown by way of illustration only, many other contact pad configurations being possible. For example, configurations may have multiple signal contact pads, and/or multiple, shield contact pads. Multiple shield contact pads could be connected with shields that are not connected to each other. In one alternate contact pad configuration, illustrated in FIG. 7B, shield contact is made directly between shield contact pads 409 and springy lips 601. Springy lips 601 are adapted to overlie region 701, where the shield contact pads 409 are exposed, but signal were 405 is covered by insulating substrate material, thus accomplishing the foregoing.

An alternate embodiment of the present invention has sensing regions disposed on both the top surface and the bottom surface of probe body 301. In this version of the probe body, the structure may be formed by adhering two structures such as described in connection with FIG. 4 in a back-to back configuration. That is, the sensing regions 303 are placed at a common end of the probe, but on opposite surfaces. The insulating substrate on which the probes are built separates the probe halves from each other. Thus, there is a need for two signal contacts, one on each surface of probe body 301. Furthermore, in applications using two sensing regions, the shield potentials corresponding to the two sensing regions may differ relative to each other. An embodiment of the present invention, which is adapted to provide differing shield potentials to an alternate probe, as described above, is now described with reference to FIG. 8.

Figure 8:
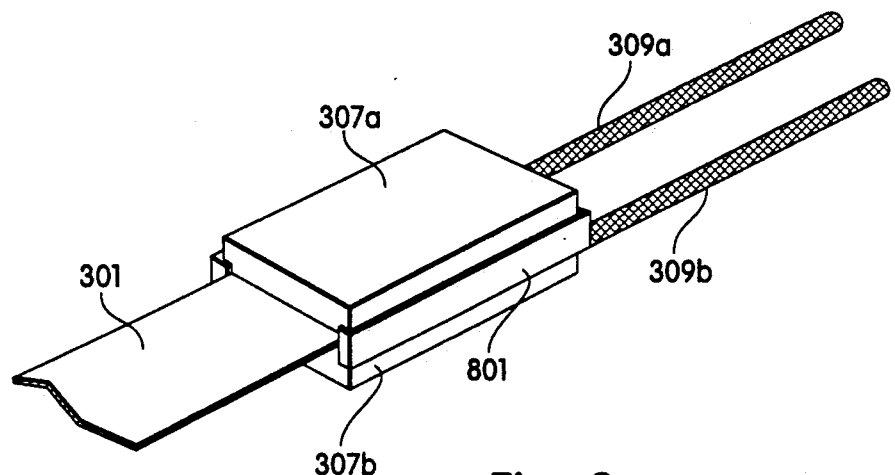
FIG. 8 is a perspective view of an alternate embodiment of a probe and connector according to the present invention.

As seen in FIG. 8, a duplex connector body may be provided with an insulating gasket 801 for separating conductive shield 307 into electrically isolated upper conductive shield 307a and lower conductive shield 307b. Thus, two separate coaxial cables 309a and 309b may be provided, having their shields held at two different electrical potentials.

Figure 9:
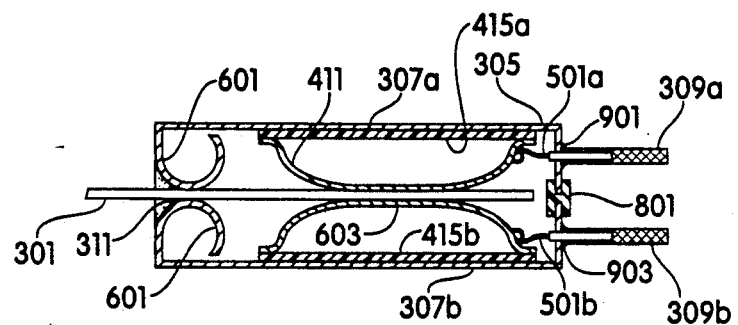
FIG. 9 is a cross sectional, elevation view of the alternate embodiment of a probe and connector in FIG. 8, taken along line 9—9.
Figure 10:
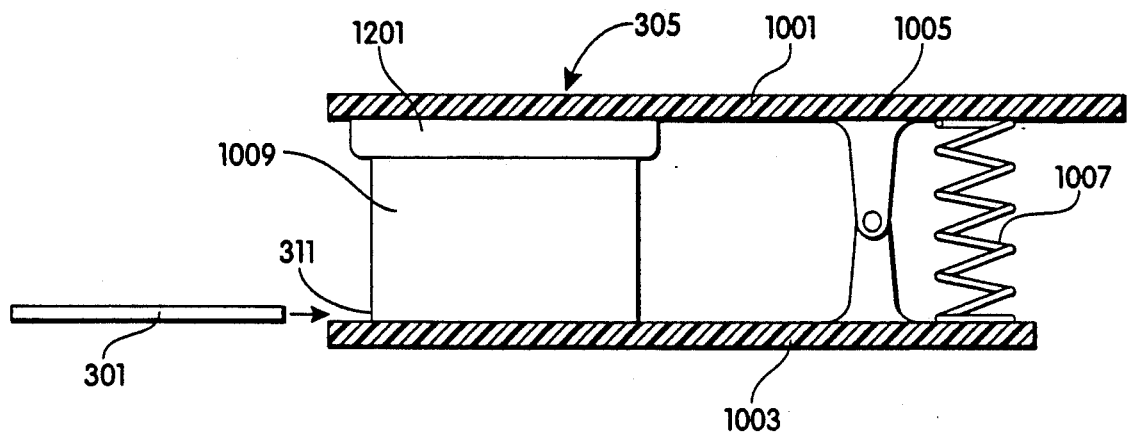
FIG. 10 is a side elevation view of an alternate embodiment of a probe and connector according to the present invention which includes an elastomeric block portion.

FIG. 9 shows how signal and shield connections are made in the duplex connector of FIG. 8. The braid of coaxial cable 309a is electrically connected by a solder fillet 901 to conductive shield 307a, while the braid of coaxial cable 309b is electrically connected by a solder fillet 903 to conductive shield 307b. Signal conductor 501a is connected to signal contact 411 in a similar manner to that shown in FIG. 6. In addition, signal conductor 501b is connected to signal contact 603. The signal contacts 411 and 603 are electrically isolated from conductive shields 307a and 307b by insulating pads 415a and 415b, respectively. Insulating pads 415a and 415b may be secured by adhesive, as required. Shield contacts 413 are disposed in contact with conductive shield 307a, as they were earlier described with respect to conductive shield 307. Additional shield contacts (not shown) are disposed in the same manner with respect to conductive shield 307b. Contacts in the connective body are adapted to mate with a pattern such as illustrated in FIG. 7A on both top and bottom of probe body 301.

In one embodiment of the present invention, probe body 301 may be formed of a rigid printed wiring board material. In other embodiments of the present invention, probe body 301 may be formed of a flexible printed wiring board material or a flex circuit. These additional embodiments differ in materials used, but are structurally similar to the embodiments described herein above.

In typical use, the connector and probe of FIG. 3 would operate as described herein. A broken or worn-out probe body 301 would be manually removed from connector opening 311. The end of a new probe body 301 having contact pads 403 and 409 would be inserted into opening 311. If the opening 311 is filled with conductive foam 313, the probe is inserted through a slit formed through foam 313, which slit forms an extension of opening 311. As the new probe body 301 is pushed further into connector body 305, the arcuate shape of contacts 411, 603 and 413 guide the probe body to a location whereat contact is made between contacts 411 and 413 and contact pads 403 and 409, respectively. The connector and probe of FIG. 9 work similarly.

Another alternate embodiment is illustrated in FIGS. 10–13. This embodiment is described first with reference to Fig. 10.

Connector body 305 comprises a pair of printed wiring cards 1001 and 1003, hinge 1005, spring 1007 and elastomeric block 1009 mounted at one end of printed wiring cards 1001 and 1003. Spring 1007 is mounted near an opposite end of printed wiring cards 1001 and 1003, with hinge 1005 disposed therebetween. Thus, spring 1007, acting to pivot printed wiring cards 1001 and 1003 about hinge 1005, provides a force that causes a sealing action at opening 311 between elastomeric block 1009 and printed wiring card 1003. To insert probe body 301 in connector body 305, pressure is manually applied in a manner to compress spring 1007, causing opening 311 to widen as printed wiring cards 1001 and 1003 pivot about hinge 1005. Probe body 301 may then be inserted into connector body 305, without interference. The pressure applied to compress spring 1007 may then be released, allowing opening 311 to close, and thus allowing elastomeric block 1009 to make contact with conductors on probe body 301. Conductors may be arranged on probe body 301 as illustrated in FIG. 7A for example, and described earlier. The elastomeric block 1009 includes conductive shield 307 as next described.

Figure 11:
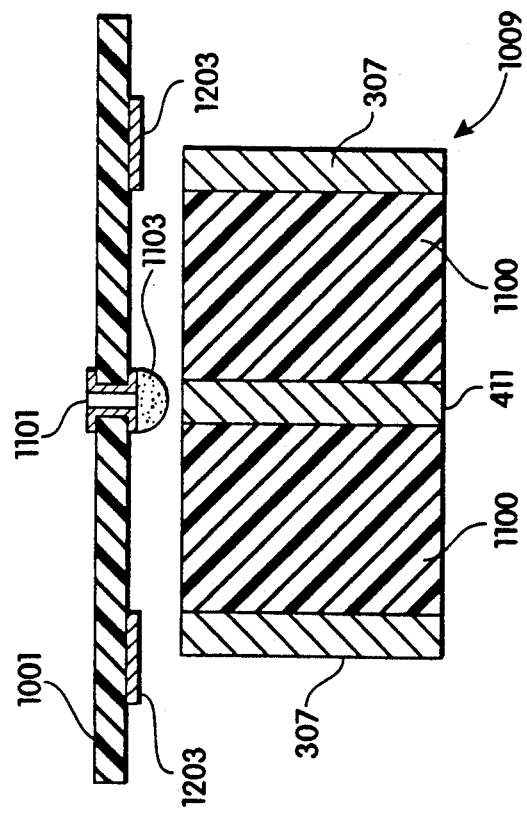
FIG. 11 is a vertical, cross-sectional view of the elements in detail 11 of FIG.. 10, just prior to assembly into the form shown in FIG. 10.

Fig. 11 shows the elastomeric block in vertical cross section, before assembly to printed wiring card 1003. Conductive shield 307 is a tubular, elastomeric outer layer which may be coextruded with the rest of the block, for example. A tubular, elastomeric insulating layer 1100 is disposed within conductive shield 307. An elastomeric conductor is disposed within the cavity of insulating layer 1100 to form signal contact 411. Printed wiring card 1001 is provided with plated through holes 1101 for making contact with signal contact 411. Alternatively, ordinary conductive tracks may be used. If it is so desired, the contact force between plated through hole 1101 and signal contact 411 may be increased by placement of a solder dot 1103 on the plated through hole 1101. Thus, when the elastomeric block is pressed against printed wiring card 1001 for mounting, as shown in FIG. 12, a secure and reliable contact with signal contact 411 may be made.

Figure 12:
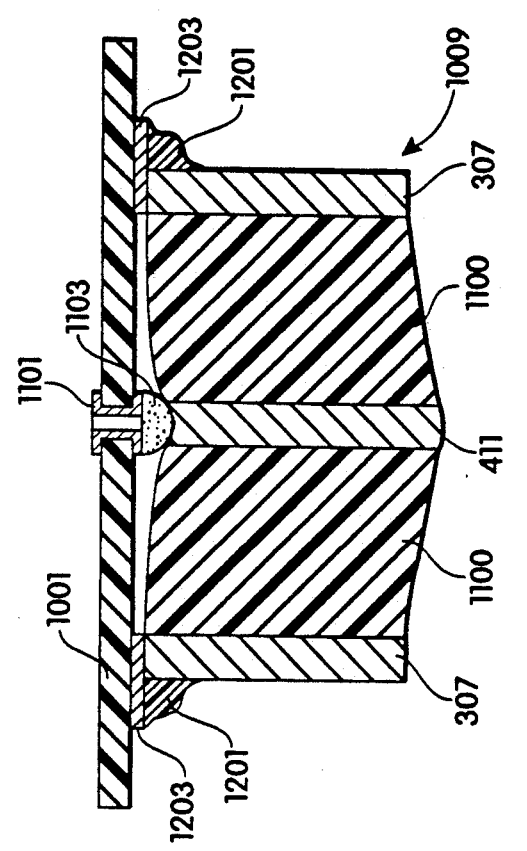
FIG. 12 is a vertical cross sectional view of detail 11, subsequent to assembly.

In FIG. 12, the elastomeric block has been fastened to printed wiring card 1001 with a conductive epoxy bead 1201. Conductive epoxy bead 1201 also provides electrical contact between conductive shield 307 and shield traces 1203 on printed wiring card 1001.

Figure 13:
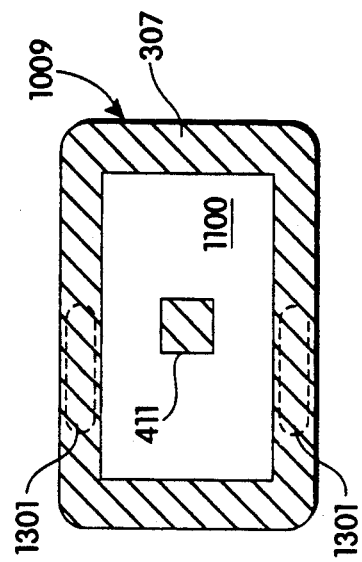
FIG 13 is a horizontal cross-section taken at the surface of the elastomeric block.

The exposed surface of elastomeric block 1009, which forms one side of opening 311, is confiqured as shown in Fig. 13. Conductive shield 307 forms a conductive perimeter, insulated by insulating layer 1100 from signal contact 411. This configuration is suitable for mating with the contact pattern illustrated in FIG. 7A and described earlier, for example. Thus, the surface of elastomeric block 1009 formed by conductive shield 307 is a shield contact.

Figure 14:
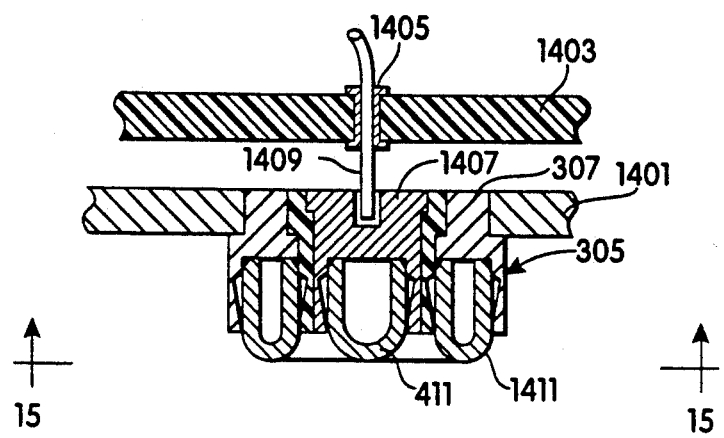
FIG 14 is a cross sectional view of an alternate embodiment of a connector according to the present invention, taken along line 14–in FIG. 15.
Figure 15:
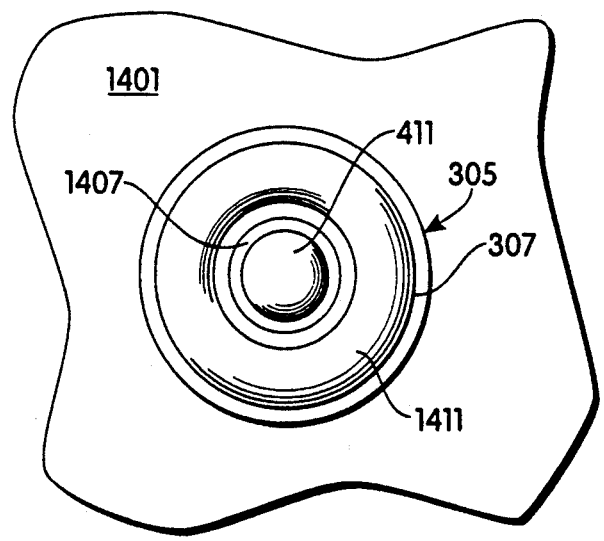
FIG 15 is a cut-away view of the connector of FIG. 14, viewed from direction 15 in FIG. 14.

Yet another alternate embodiment is illustrated in Figs. 14 and 15. This embodiment is described first with reference to FIG. 14.

In the embodiment of FIG. 14, connector body 305 comprises a circular, conductive shield 307. Conductive shield 307 may be made of any suitable conductive material, such as a metal. The conductive shield 307 of connector body 305 may be soldered directly to a metal or metal clad enclosure 1401. Enclosure 1401 may, for example, contain sensitive circuitry disposed on printed wiring board 1403. It will be understood that enclosure 1401 fully encloses printed wiring board 1403, so as to completely shield the sensitive circuitry disposed thereon from electrical interference. A connection is made from signal contact 411 to plated through hole 1405 through contact cup 1407 and wire 1409. Shield contact 1411 is captured by connector body 305, so as to complete an electrical connection with enclosure 1401. Signal contact 411 and shield contact 1411 may be formed of springy metal material, elastomeric material, or any other suitable springy or resilient conductive material, for example.

Figure 7B:
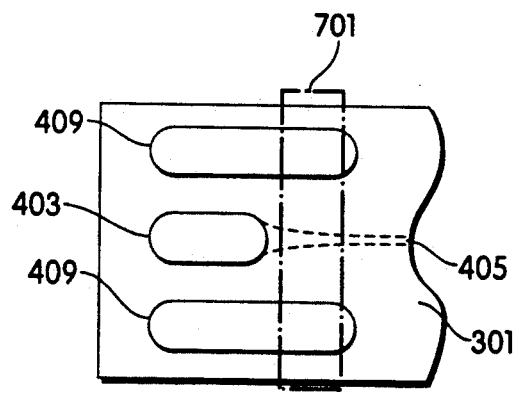
FIG. 7B illustrates an alternate configuration of the contact pad region of FIG. 7A.

In use, the alternate embodiment just described may be used to make contact to contact pads such as those shown in FIGS. 7A and 7B. Not shown in FIG. 14 is apparatus for receiving, for example, a probe body 301 as shown in FIGS. 10–14. A similar arrangement to that shown in those Figs. may be used.

FIG. 15 is a view from direction 15 as shown in FIG. 14. As seen in this Fiq., the connector of this embodiment is circular.

Since the connector parts associated with probe body 301 may be formed by conventional printed wiring techniques, the probe body is inexpensive to produce. The connector body 305 bears the more substantial cost of manufacture, but may also be formed more readily than connectors of the prior art, such as that illustrated in Fiq. 2. Furthermore, this type of connector permits probe bodies to be replaced in a simple manner by the customer. Thus, there is little cost burden in either material or labor in replacing the portions of the probe which is most likely to wear out or be broken, substantially reducing the long term cost of utilizing the probe.

Figure 1:
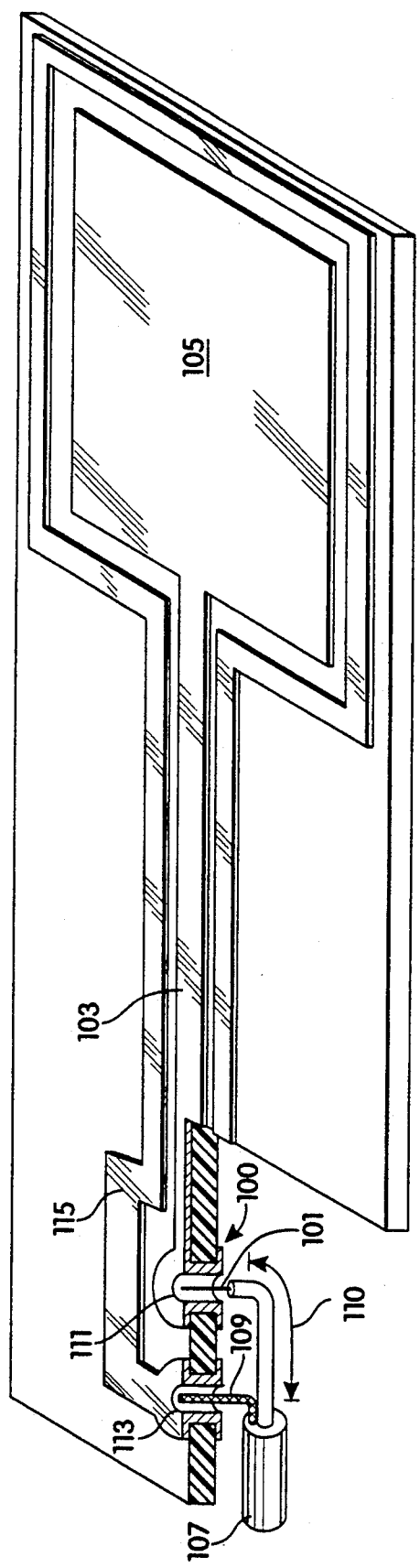
FIG. 1 is a top perspective view of a probe of the prior art, showing the connection between the probe and the cable.
Figure 2:
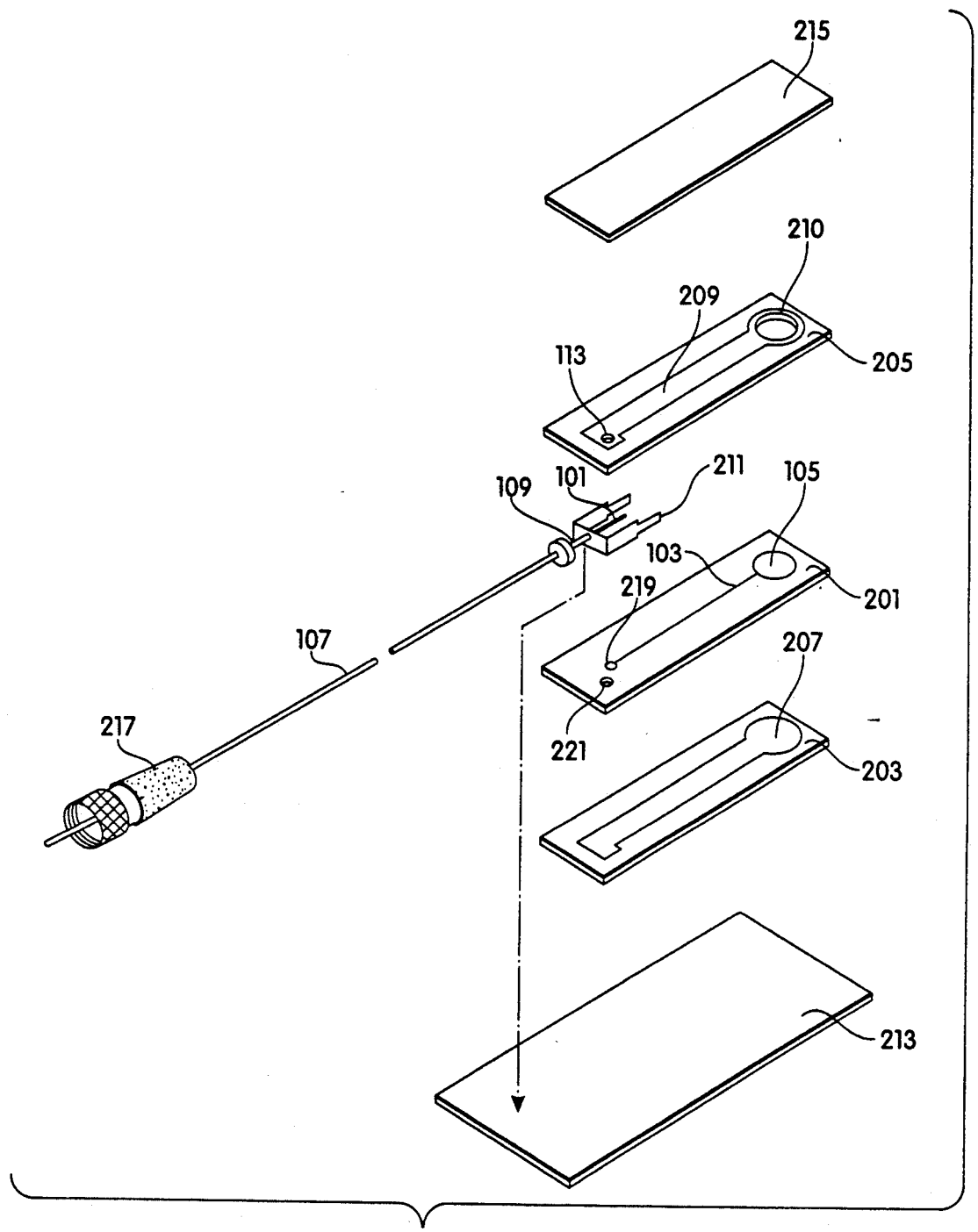
FIG. 2 is an exploded, perspective view of another probe of the prior art, showing an alternative, shielded connection between a cable and the probe.

Finally, the connector of the present invention facilitates shielding of the entire signal path, particularly by covering the immediate vicinity of the connection between the probe body 301 and coaxial cable 309. Means are provided for maintaining electrical continuity from the coaxial cable 309 to shield layers within probe body 301, through the connector body 305. Thus, superior probe performance is achieved over the prior art shown in FIG. 1.

It should now be readily apparent that the proximity probe of the foregoing discussion could, in fact, be any shielded, printed wiring board or flex circuit having suitable features according to the present invention. Thus, the present invention could be practiced wherever a low-cost, shielded connection is required between signal conductors in shielded cables and an inexpensive, shielded, printed wiring board.

For example, in a disc drive apparatus, shielded head wires are connected to a printed wiring board carrying read/write circuitry. This connection may be made by separating the signal wires and shield wires of the head cable for insertion into an unshielded connector. The connector is plugged onto a header strip on the printed wiring board. Such unshielded signal wires may provide an undesirable noise source in the system.

By practicing the present invention, this connection could be made using a shielded connector. Thus, the exposed signal wires are not exposed to external noise sources, removing a potential source of noise in the sensitive read/write circuitry.

Although the present invention has been described in connection with preferred and alternate embodiments, numerous extensions, modifications and other applications should now be evident to those skilled in the art. The embodiments presented are illustrative, and not limiting, having been presented by way of example only. The scope of the present invention is limited only by the appended claims and equivalents thereto.

What is claimed is:

1. A shielded connector for making electrical connections when mated with a circuit board including at least a signal conductor having a signal contact pad and a shield conductor having a shield contact pad exposed at one surface of a circuit board, the connector comprising:

a conductive shield, defining means for receiving an edge of the circuit board, said conductive shield including a shield contact positioned to cooperatively engage said shield contact pad when said connector and said circuit board are mated and said conductive shield further defining a void surrounded by said conductive shield;

an insulator disposed within said void and attached to a surface of said conductive shield within said void; and a signal contact, disposed within said void and insulated from said conductive shield by said insulator and positioned to cooperatively engage said signal contact pad when said connector and said circuit board are mated.

2. A shielded connector as claimed in claim 1 wherein said conductive shield and said signal contact are formed of a conductive elastomer.

3. A shielded connector as claimed in claim 2 wherein said insulator is formed of a non-conductive elastomer.

4. A shielded connector as claimed in claim 3 wherein said conductive shield and said insulator are tubular members having interior surfaces, said signal contact is in contacting engagement with said interior surface of said insulator, and said insulator is in contacting engagement with said interior surface of said conductive shield.

5. A capacitive probe board for mating with a shielded connector having a signal contact and a shield contact, said capacitive probe board comprising:

a plurality of insulating substrate layers;

a plurality of shield conductors;

a signal conductor disposed between two said insulating layers, said signal conductor and said two insulating layers being disposed between two said shield conductors;

means electrically connected to said signal conductor and disposed on an outer surface of said circuit board, for cooperatively engaging said signal contact when said capacitive probe board and said connector are mated;

means electrically connected to said shield conductors and disposed on an outer surface of said capacitive probe board, for cooperatively engaging said shield contact when said capacitive probe board and said connector are mated; and a sensing region defined by an aperture through one said shield conductor at an end distal from said means for cooperatively engaging said shield contact.

6. A shielded connector system comprising:

a circuit board having a plurality of insulating substrate layers, a plurality of shield conductors, a signal conductor disposed between two said insulating layers, said signal conductor and said two insulating layers being disposed between two said shield conductors, a signal contact pad electrically connected to said signal conductor and exposed to an outer surface of said circuit board through holes formed in at least one said substrate layer and at least one said shield conductor, for providing an electrical connection to said signal conductor, and a shield contact pad electrically connected to said shield conductors and disposed on an outer surface of said circuit board, for providing an electrical connection to said shield conductors; and a connector for mating with said circuit board having a conductive shield, defining means for receiving an edge of the circuit board, said conductive shield including a shield contact positioned to cooperatively engage said shield contact pads when said connector and said circuit board are mated, and said conductive shield further defining a void surrounded by said conductive shield;

an insulator disposed within said void and attached to a surface of said conductive shield within said void, and a signal contact, disposed within said conductive shield and insulated therefrom by said insulator and positioned to cooperatively engage said signal contact pad when said connector and said circuit board are mated.

7. A shielded connector system as claimed in claim 6, wherein said circuit board is a capacitive probe having a sensing region defined by an aperture through one said shield conductor at an end distal from said means for cooperatively engaging said shield contact.

8. A shielded connector system as claimed in claim 6 wherein said conductive shield and said signal contact are formed of a conductive elastomer.

9. A shielded connector system as claimed in claim 8 wherein said insulator is formed of a non-conductive elastomer.

10. A shielded connector system as claimed in claim 9 wherein said conductive shield and said insulator are tubular members having interior surfaces, said signal contact is in contacting engagement with said interior surface of said insulator, and said insulator is in contacting engagement with said interior surface of said conductive shield.

11. A shielded connector system as claimed in claim 10 wherein said circuit board is a capacitive probe having a sensing region defined by an aperture through one said shield conductor at an end distal from said means for cooperatively engaging said shield contact.

12. A shielded connector system comprising:

a circuit board having a plurality of insulating substrate layers, a plurality of shield conductors, a plurality of signal conductors, each disposed between two said insulating layers, each said signal conductor and said two insulating layers being disposed between a pair of said shield conductors and each pair of shield conductors disposed on opposite surfaces of one of said insulating substrate layers, a plurality of signal contact pads, each electrically connected to one said signal conductor and exposed to opposite outer surfaces of said circuit board through holes formed in at least one said substrate layer and at least one said shield conductor, for providing an electrical connection to each said signal conductor, and a plurality of shield contact pads, each electrically connected to one said pair of said shield conductors and disposed on opposite outer surfaces of said circuit board, for providing an electrical connection to each said pair of said shield conductors; and a connector for mating with said circuit board having a plurality of conductive shields, defining means for receiving an edge of the circuit board, said conductive shields each including a shield contact positioned cooperatively engage one of said shield contact pads when said connector and said circuit board are mated and each said conductive shield further defining a void surrounded by said conductive shields, a plurality of insulators, each disposed within one said void and attached to a surface of said conductive shield within said void, and a plurality of signal contacts, each disposed within one said conductive shield and insulated therefrom by one said insulator and positioned to cooperatively engage one said signal contact pad when said connector and said circuit board are noted.

13. A shielded connector system as claimed in claim 12, wherein said circuit board is a capacitive probe having a plurality of sensing regions, each defined by an aperture through one said shield conductor at an end distal from said means for cooperatively engaging said shield contact.

* * * * *